US012638771B2

(12) United States Patent
Zi et al.

(10) Patent No.: US 12,638,771 B2
(45) Date of Patent: May 26, 2026

(54) PHOTORESIST, METHOD OF MANUFACTURING A SEMICONDUCTOR DEVICE AND METHOD OF EXTREME ULTRAVIOLET LITHOGRAPHY

(71) Applicant: TAIWAN SEMICONDUCTOR MANUFACTURING COMPANY, LTD., Hsinchu (TW)

(72) Inventors: An-Ren Zi, Hsinchu City (TW); Cheng-Han Wu, Taichung City (TW); Ching-Yu Chang, Yilang County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/692,490

(22) Filed: Mar. 11, 2022

(65) Prior Publication Data

US 2023/0288807 A1 Sep. 14, 2023

(51) Int. Cl.

| | |
|---|---|
| ***G03F 7/09*** | (2006.01) |
| ***G03F 7/20*** | (2006.01) |
| ***H10P 76/20*** | (2026.01) |

(52) U.S. Cl.

CPC .......... *G03F 7/094* (2013.01); *H10P 76/2041* (2026.01); *G03F 7/2004* (2013.01)

(58) Field of Classification Search

CPC ... G03F 7/094; G03F 7/2004; H01L 21/0274; H10P 76/2041

See application file for complete search history.

(56) References Cited

U.S. PATENT DOCUMENTS

| | | | | |
|---|---|---|---|---|
| 8,764,995 | B2 | 7/2014 | Chang et al. | |
| 8,796,666 | B1 | 8/2014 | Huang et al. | |
| 8,828,625 | B2 | 9/2014 | Lu et al. | |
| 8,841,047 | B2 | 9/2014 | Yu et al. | |
| 8,877,409 | B2 | 11/2014 | Hsu et al. | |
| 9,093,530 | B2 | 7/2015 | Huang et al. | |
| 9,184,054 | B1 | 11/2015 | Huang et al. | |
| 9,256,123 | B2 | 2/2016 | Shin et al. | |
| 9,529,268 | B2 | 12/2016 | Chang et al. | |
| 9,548,303 | B2 | 1/2017 | Lee et al. | |
| 2005/0019689 | A1 * | 1/2005 | Kodama | G03F 7/0045 430/311 |
| 2007/0117044 | A1 * | 5/2007 | Ogihara | G03F 7/094 430/270.1 |
| 2009/0053651 | A1 * | 2/2009 | Hatakeyama | G03F 7/0397 430/285.1 |

(Continued)

FOREIGN PATENT DOCUMENTS

JP 5183449 B2 * 4/2013

*Primary Examiner* — Jonathan Johnson
*Assistant Examiner* — Alexander N. Lee
(74) *Attorney, Agent, or Firm* — Birch, Stewart, Kolasch & Birch, LLP

(57) ABSTRACT

A method of manufacturing a semiconductor device includes forming a multilayer photoresist stack over a substrate, in which the multilayer photoresist stack has a first photoresist layer and a second photoresist layer over the first photoresist layer, and the second photoresist layer is less reactive to hydrogen than the first photoresist layer, exposing the multilayer photoresist stack to an EUV radiation, and developing the exposed multilayer photoresist stack.

20 Claims, 12 Drawing Sheets

(56) References Cited

U.S. PATENT DOCUMENTS

| | | | | |
|---|---|---|---|---|
| 2009/0234155 | A1* | 9/2009 | Oh | C07C 69/712<br>562/109 |
| 2010/0304300 | A1* | 12/2010 | Kodama | G03F 7/0395<br>430/325 |
| 2011/0147985 | A1* | 6/2011 | Cheng | G03F 7/2041<br>264/225 |
| 2012/0177891 | A1* | 7/2012 | Millward | G03F 7/091<br>438/702 |
| 2014/0145313 | A1* | 5/2014 | Li | H01L 21/76816<br>438/701 |
| 2014/0199543 | A1* | 7/2014 | Ehm | G02B 1/105<br>428/336 |
| 2015/0253673 | A1* | 9/2015 | Iwato | G03F 7/0392<br>430/323 |
| 2018/0031972 | A1* | 2/2018 | Hustad | H01L 21/0274 |
| 2018/0368241 | A1* | 12/2018 | Dijksman | H05G 2/005 |

* cited by examiner

10

622

622
624
626

628

630

632

634

636

638

PHOTORESIST, METHOD OF MANUFACTURING A SEMICONDUCTOR DEVICE AND METHOD OF EXTREME ULTRAVIOLET LITHOGRAPHY

BACKGROUND

As modem integrated circuits shrink in size, the associated features shrink in size as well. Lithography is a mechanism by which a pattern on a mask is projected onto a substrate such as a semiconductor wafer. In areas such as semiconductor photolithography, it has become necessary to create images on the semiconductor wafer which incorporate minimum feature sizes under a resolution limit or critical dimension (CD). Semiconductor photolithography typically includes the steps of applying a coating of photoresist (also referred to as resist) on a top surface (e.g., a thin film stack) of a semiconductor wafer and exposing the photoresist to a pattern. The semiconductor wafer is then transferred to a developing chamber to remove the exposed resist, which is soluble to an aqueous developer solution. As a result, a patterned layer of photoresist exists on the top surface of the wafer.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
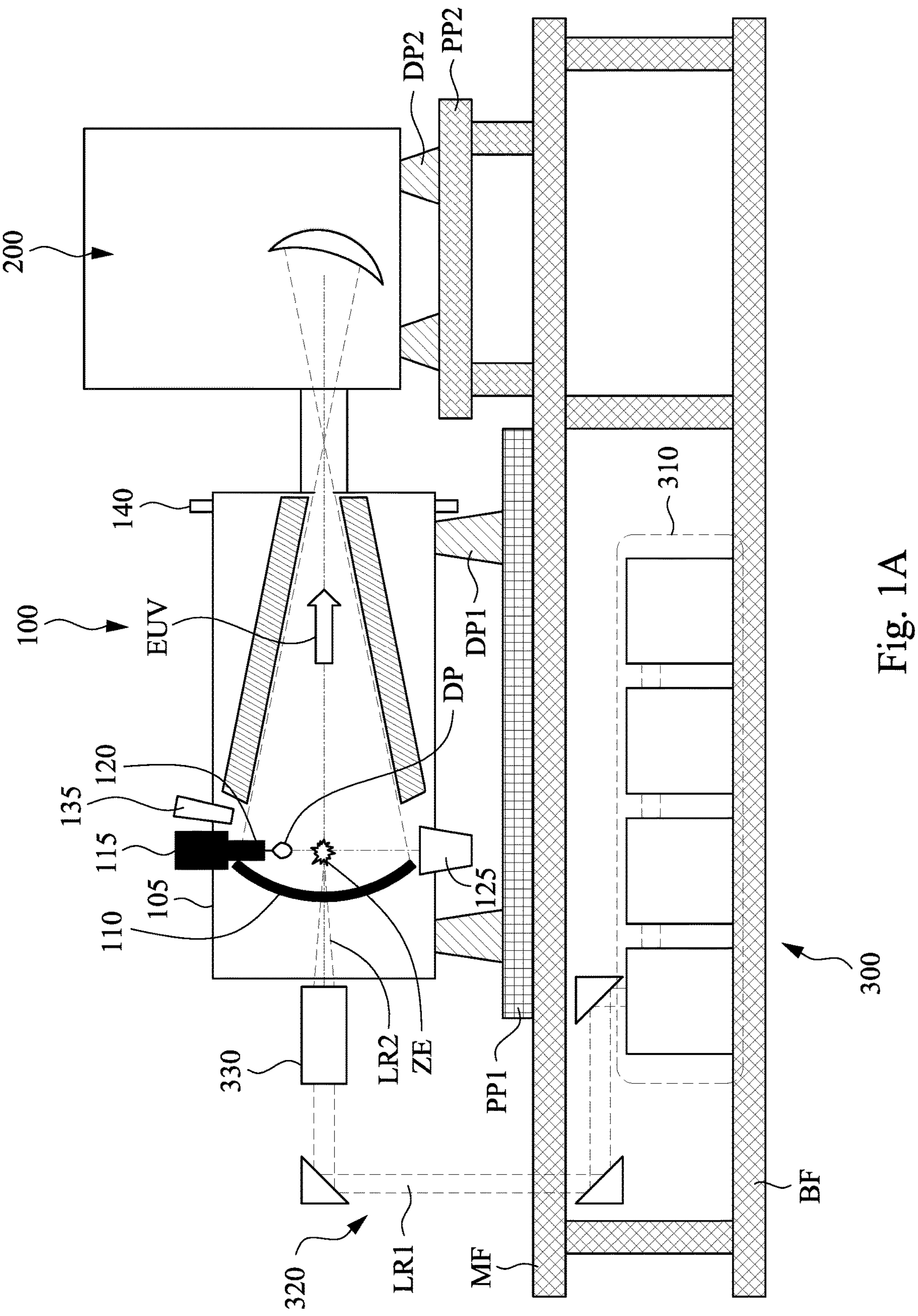
FIG. 1A is a schematic view of an EUV lithography tool with an LPP-based EUV radiation source, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a schematic view diagram of a EUV lithography system 10, constructed in accordance with some embodiments. The EUV lithography system 10 may also be generically referred to as a scanner that is configured to perform lithography exposure processes with respective radiation source and exposure mode. The EUV lithography system 10 is designed to expose a photoresist layer by EUV light or EUV radiation. The photoresist layer is a material sensitive to the EUV light. The EUV lithography system 10 employs a radiation source 100 to generate EUV light, such as EUV light having a wavelength ranging between about 1 nm and about 100 nm. In one particular example, the radiation source 100 generates a EUV light with a wavelength centered at about 13.5 nm. Accordingly, the radiation source 100 is also referred to as EUV radiation source 100.

Extreme ultraviolet (EUV) lithography has become widely used due to its ability to achieve small semiconductor device sizes, for example for 20 nanometer (nm) technology nodes or smaller. In EUV light production, tin metal is heated above its melting point, and small droplets of tin are rapidly produced. These droplets of tin are first vaporized and then excited with high power lasers. The excited tin atoms emit EUV light at 13.5 nm. The scattered tin debris from vaporization of droplets is a major potential source of contamination of both the collector and focusing optics. Accordingly, the EUV tools may be contained within a hydrogen gas ambient. The hydrogen gas is used to react with the scattered tin debris to form stannane ($SnH_4$), which is then removed from the chamber 105 by means of a vacuum line. However, the hydrogen radicals from this hydrogen gas may have shortcomings with pattern accuracy of the photoresist layer. For example, due to the reaction between the hydrogen radicals and the photoresist layer, unwanted defect, leading to degradation of line width roughness (LWR), may form and some of the product of the reaction with smaller molecular weight may outgas, which may contaminate or otherwise be detrimental to the environment in the EUV lithography system 10.

The present disclosure provides a novel multilayer photoresist stack having an upper photoresist layer being less reactive to hydrogen (e.g., hydrogen radicals) than a lower photoresist layer. This offers more control for the quality of patterned photoresist using EUV radiation. Consequently, LWR and critical dimension uniformity (CDU) of the multilayer photoresist stack can be improved. The various aspects of the present disclosure will be discussed below in greater detail with reference to FIGS. 1A-26. First, a EUV lithography system will be discussed below with reference to FIGS. 1A, 1B and 2. Next, the details of the novel multilayer photoresist stack will be discussed below with reference to FIGS. 9-26. Finally, the lithography process employing the novel multilayer photoresist stack will be discussed with reference to FIGS. 3-8.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

To address the trend of the Moore's law for decreasing size of chip components and the demand of higher computing power chips for mobile electronic devices such as smart phones with computer functions, multi-tasking capabilities, or even with workstation power. Smaller wavelength photolithography exposure systems are desirable. Extreme ultraviolet (EUV) photolithography technique uses an EUV radiation source to emit an EUV light ray with wavelength of about 13.5 nm. Because this wavelength is also in the x-ray radiation wavelength region, the EUV radiation source is also called a soft x-ray radiation source. The EUV light rays emitted from a laser-produced plasma (LPP) are collected by a collector mirror and reflected toward a patterned mask.

FIG. 1A is a schematic view of an EUV lithography tool with an LPP-based EUV radiation source, in accordance with some embodiments of the present disclosure. The EUV lithography system includes an EUV radiation source 100 to generate EUV radiation, an exposure device 200, such as a scanner, and an excitation laser source 300. As shown in FIG. 1A, in some embodiments, the EUV radiation source 100 and the exposure device 200 are installed on a main floor MF of a clean room, while the excitation laser source 300 is installed in a base floor BF located under the main floor MF. Each of the EUV radiation source 100 and the exposure device 200 are placed over pedestal plates PP1 and PP2 via dampers DP1 and DP2, respectively. The EUV radiation source 100 and the exposure device 200 are coupled to each other by a coupling mechanism, which may include a focusing unit.

The EUV lithography tool is designed to expose a resist layer to EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure device 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a mask secured on the mask stage. In some embodiments, the mask stage includes an electrostatic chuck (e-chuck) to secure the mask.

Figure 1B:
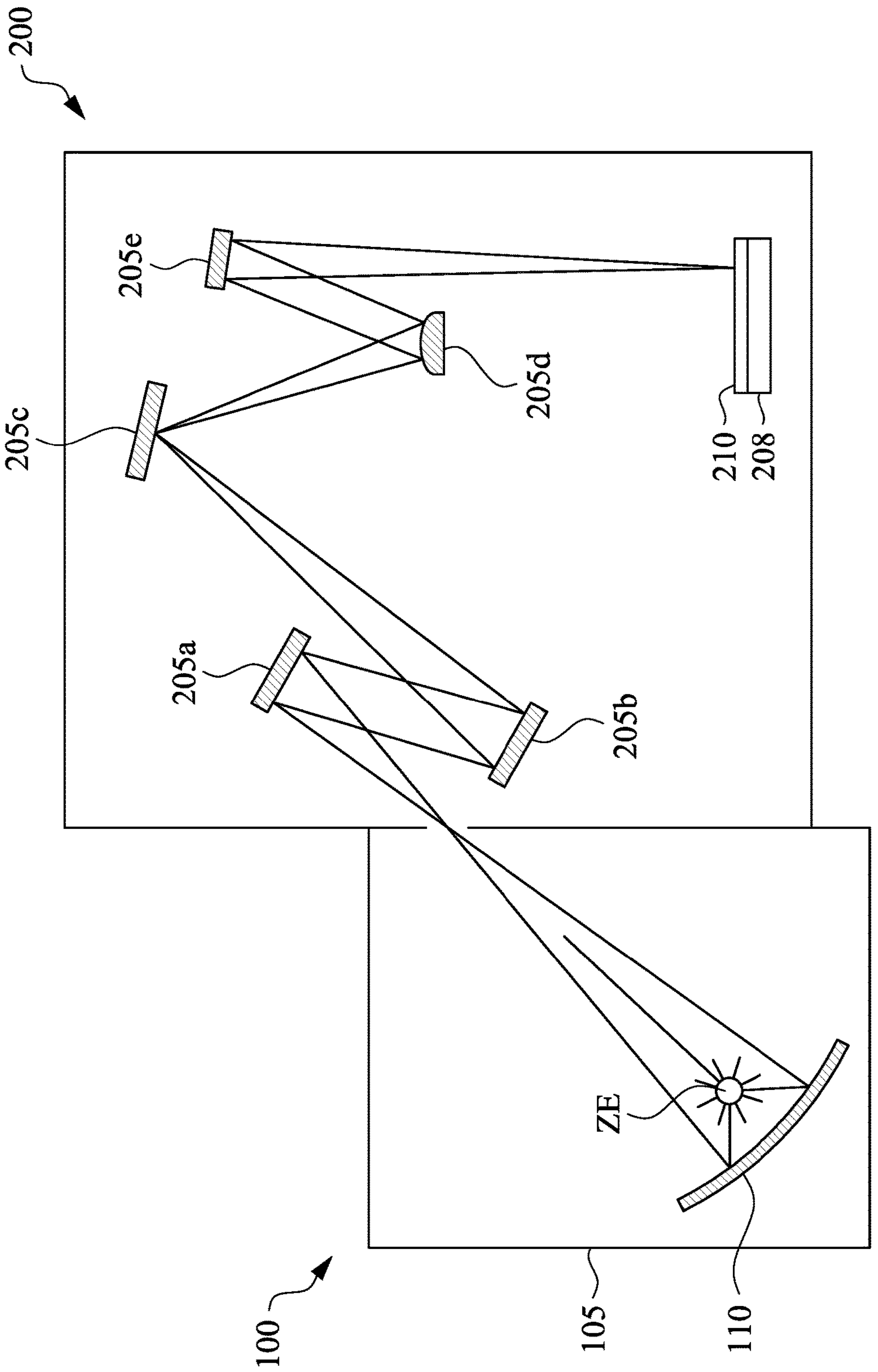
FIG. 1B is a simplified schematic diagram of a detail of an extreme ultraviolet lithography tool according to an embodiment of the disclosure showing the exposure of photoresist coated substrate with a patterned beam of EUV light.

FIG. 1B is a simplified schematic diagram of a detail of an extreme ultraviolet lithography tool according to an embodiment of the disclosure showing the exposure of photoresist coated substrate 210 secured on a substrate stage 208 of the exposure device 200 with a patterned beam of EUV light. The exposure device 200 is an integrated circuit lithography tool such as a stepper, scanner, step and scan system, direct write system, device using a contact and/or proximity mask, etc., provided with one or more optics 205*a*, 205*b*, for example, to illuminate a patterning optic 205*c*, such as a reticle, with a beam of EUV light, to produce a patterned beam, and one or more reduction projection optics 205*d*, 205*e*, for projecting the patterned beam onto the photoresist coated substrate 210. A mechanical assembly (not shown) may be provided for generating a controlled relative movement between the photoresist coated substrate 210 and the patterning optic 205*c*. As further shown in FIG. 2, the EUVL tool includes an EUV radiation source 100 including an EUV light radiator ZE emitting EUV light in a chamber 105 that is reflected by a collector 110 along a path into the exposure device 200 to irradiate the photoresist coated substrate 210.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gradings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic", as used herein, is directed to, but not limited to, components which operate solely or to advantage within one or more specific wavelength range(s) such as at the EUV output light wavelength, the irradiation laser wavelength, a wavelength suitable for metrology or any other specific wavelength.

In various embodiments of the present disclosure, the photoresist coated substrate 210 is a semiconductor wafer, such as a silicon wafer or other type of wafer to be patterned.

The EUVL tool further includes other modules or is integrated with (or coupled with) other modules in some embodiments. As shown in FIG. 1A, the EUV radiation source 100 includes a target droplet generator 115 and a collector 110, enclosed by a chamber 105. For example, the collector 110 is a laser-produced plasma (LPP) collector. In various embodiments, the target droplet generator 115 includes a reservoir to hold a source material and a nozzle 120 through which target droplets DP of the source material are supplied into the chamber 105.

In some embodiments, the target droplets DP are metal droplets of tin (Sn), lithium (Li), or an alloy of Sn and Li. In some embodiments, the target droplets DP each have a diameter in a range from about 10 microns (μm) to about 100

μm. For example, in an embodiment, the target droplets DP are tin droplets, having a diameter of about 10 μm to about 100 μm. In other embodiments, the target droplets DP are tin droplets having a diameter of about 25 μm to about 50 μm. In some embodiments, the target droplets DP are supplied through the nozzle 120 at a rate in a range from about 50 droplets per second (i.e., an ejection-frequency of about 50 Hz) to about 50,000 droplets per second (i.e., an ejection-frequency of about 50 kHz).

Referring back to FIG. 1A, an excitation laser LR2 generated by the excitation laser source 300 is a pulse laser. The laser pulses LR2 are generated by the excitation laser source 300. The excitation laser source 300 may include a laser generator 310, laser guide optics 320 and a focusing apparatus 330. In some embodiments, the laser generator 310 includes a carbon dioxide ($CO_2$) or a neodymium-doped yttrium aluminum garnet (Nd:YAG) laser source with a wavelength in the infrared region of the electromagnetic spectrum. For example, the laser generator 310 has a wavelength of about 9.4 μm or about 10.6 μm, in an embodiment. The laser light LR1 generated by the laser generator 310 is guided by the laser guide optics 320 and focused into the excitation laser LR2 by the focusing apparatus 330, and then introduced into the EUV radiation source 100.

In some embodiments, the excitation laser LR2 includes a pre-heat laser and a main laser. In such embodiments, the pre-heat laser pulse (interchangeably referred to herein as the "pre-pulse") is used to heat (or pre-heat) a given target droplet to create a low-density target plume with multiple smaller droplets, which is subsequently heated (or reheated) by a pulse from the main laser, generating increased emission of EUV light.

In various embodiments, the pre-heat laser pulses have a spot size about 100 μm or less, and the main laser pulses have a spot size in a range of about 150 μm to about 300 μm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser LR2 is matched with (e.g., synchronized with) the ejection-frequency of the target droplets DP in an embodiment.

The excitation laser LR2 is directed through windows (or lenses) into the zone of excitation ZE in front of the collector 110. The windows are made of a suitable material substantially transparent to the laser beams. The generation of the pulse lasers is synchronized with the ejection of the target droplets DP through the nozzle 120. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation EUV, which is collected by the collector 110. The collector 110 further reflects and focuses the EUV radiation for the lithography exposing processes performed through the exposure device 200. The droplet catcher 125 is used for catching excessive target droplets. For example, some target droplets may be purposely missed by the laser pulses.

In some embodiments, the collector 110 is designed with a proper coating material and shape to function as a mirror for EUV collection, reflection, and focusing. In some embodiments, the collector 110 is designed to have an ellipsoidal geometry. In some embodiments, the coating material of the collector 110 is similar to the reflective multilayer of the EUV mask. In some examples, the coating material of the collector 110 includes a ML (such as a plurality of Mo/Si film pairs) and may further include a capping layer (such as Ru) coated on the ML to substantially reflect the EUV light. In some embodiments, the collector 110 may further include a grating structure designed to effectively scatter the laser beam directed onto the collector 110. For example, a silicon nitride layer is coated on the collector 110 and is patterned to have a grating pattern.

In the present disclosure, the terms mask, photomask, and reticle are used interchangeably. In the present embodiment, the patterning optic 205*c* is a reflective mask 205*c*. The reflective mask 205*c* also includes a reflective ML deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light.

The mask 205*c* may further include a capping layer, such as ruthenium (Ru), disposed on the ML for protection. The mask 205*c* further includes an absorption layer deposited over the ML. The absorption layer is patterned to define a layer of an integrated circuit (IC), the absorber layer is discussed below in greater detail according to various aspects of the present disclosure. Alternatively, another reflective layer may be deposited over the ML and is patterned to define a layer of an integrated circuit, thereby forming a EUV phase shift mask.

The mask 205*c* and the method making the same are further described in accordance with some embodiments. In some embodiments, the mask fabrication process includes two operations: a blank mask fabrication process and a mask patterning process. During the blank mask fabrication process, a blank mask is formed by deposing suitable layers (e.g., reflective multiple layers) on a suitable substrate. The blank mask is then patterned during the mask patterning process to achieve a desired design of a layer of an integrated circuit (IC). The patterned mask is then used to transfer circuit patterns (e.g., the design of a layer of an IC) onto a semiconductor wafer. The patterns can be transferred over and over onto multiple wafers through various lithography processes. A set of masks is used to construct a complete IC.

Figure 2:
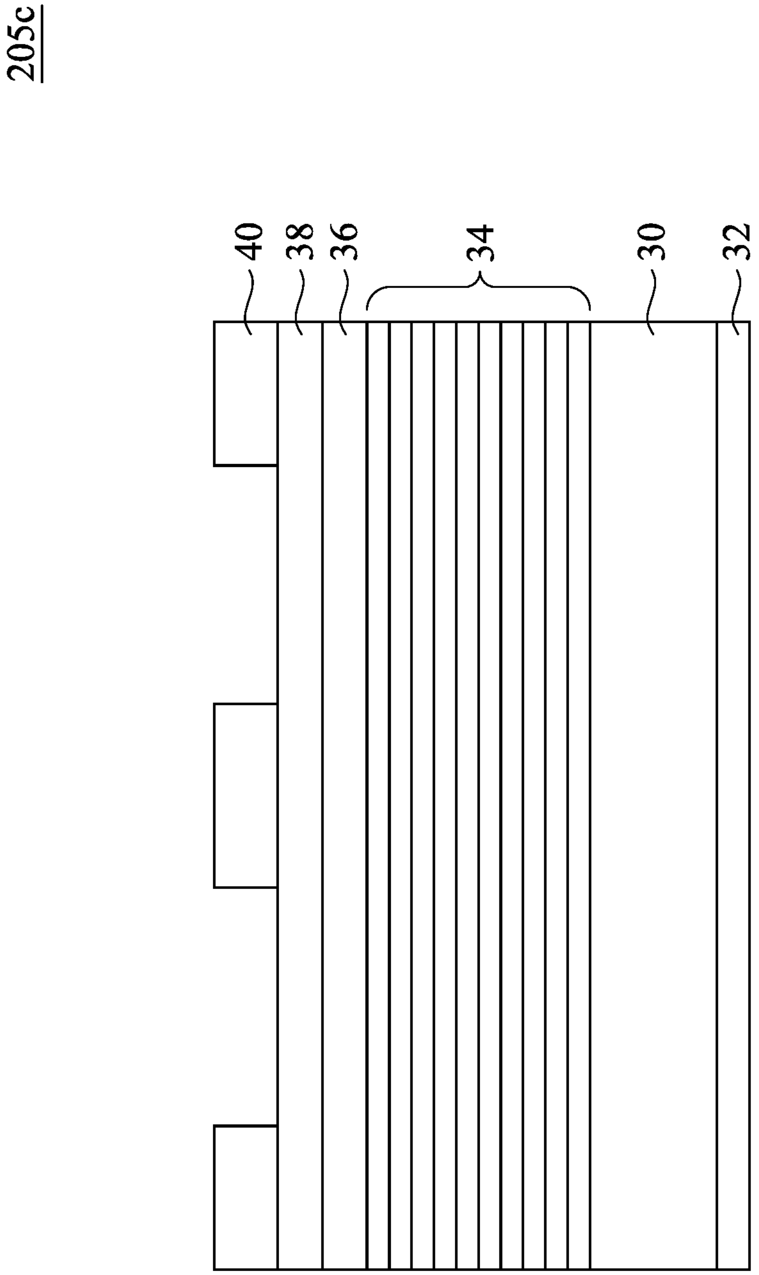
FIG. 2 is a sectional view of a EUV mask constructed in accordance with some embodiments of the present disclosure.

One example of the reflective mask 205*c* is shown in FIG. 2. The reflective mask 205*c* in the illustrated embodiment is a EUV mask, and includes a substrate 30 made of a LTEM. The LTEM material may include $TiO_2$ doped $SiO_2$, and/or other low thermal expansion materials known in the art. In some embodiments, a conductive layer 32 is additionally disposed under on the backside of the LTEM substrate 30 for the electrostatic chucking purpose. In one example, the conductive layer 32 includes chromium nitride (CrN), though other suitable compositions are possible.

The reflective mask 205*c* includes a reflective multilayer (ML) structure 34 disposed over the LTEM substrate 30. The ML structure 34 may be selected such that it provides a high reflectivity to a selected radiation type/wavelength. The ML structure 34 includes a plurality of film pairs, such as Mo/Si film pairs (e.g., a layer of molybdenum above or below a layer of silicon in each film pair). Alternatively, the ML structure 34 may include Mo/Be film pairs, or any materials with refractive index difference being highly reflective at EUV wavelengths.

Still referring to FIG. 2, the EUV mask 205*c* also includes a capping layer 36 disposed over the ML structure 34 to prevent oxidation of the ML. The EUV mask 205*c* may further include a buffer layer 38 disposed above the capping layer 36 to serve as an etching-stop layer in a patterning or repairing process of an absorption layer, which will be described later. The buffer layer 38 has different etching characteristics from the absorption layer disposed thereabove. The buffer layer 38 includes ruthenium (Ru), Ru compounds such as RuB, RuSi, chromium (Cr), chromium oxide, and chromium nitride in various examples.

The EUV mask 205*c* also includes an absorber layer 40 (also referred to as an absorption layer) formed over the buffer layer 38. In some embodiments, the absorber layer 40 absorbs the EUV radiation directed onto the mask. In various embodiments, the absorber layer may be made of tantalum boron nitride (TaBN), tantalum boron oxide (TaBO), or chromium (Cr), Radium (Ra), or a suitable oxide or nitride (or alloy) of one or more of the following materials: Actium, Radium, Tellurium, Zinc, Copper, and Aluminum.

FIGS. 3-8 are cross-sectional views of a semiconductor structure 400 at various fabrication stages, constructed in accordance with some embodiments. The semiconductor structure 400 may be an intermediate workpiece fabricated during processing of an IC, or a portion thereof, that may include logic circuits, memory structures, passive components (such as resistors, capacitors, and inductors), and active components such diodes, field-effect transistors (FETs), metal-oxide semiconductor field effect transistors (MOSFET), complementary metal-oxide semiconductor (CMOS) transistors, bipolar transistors, high voltage transistors, high frequency transistors, fin-like FETs (FinFETs), other three-dimensional (3D) FETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

Figure 3:
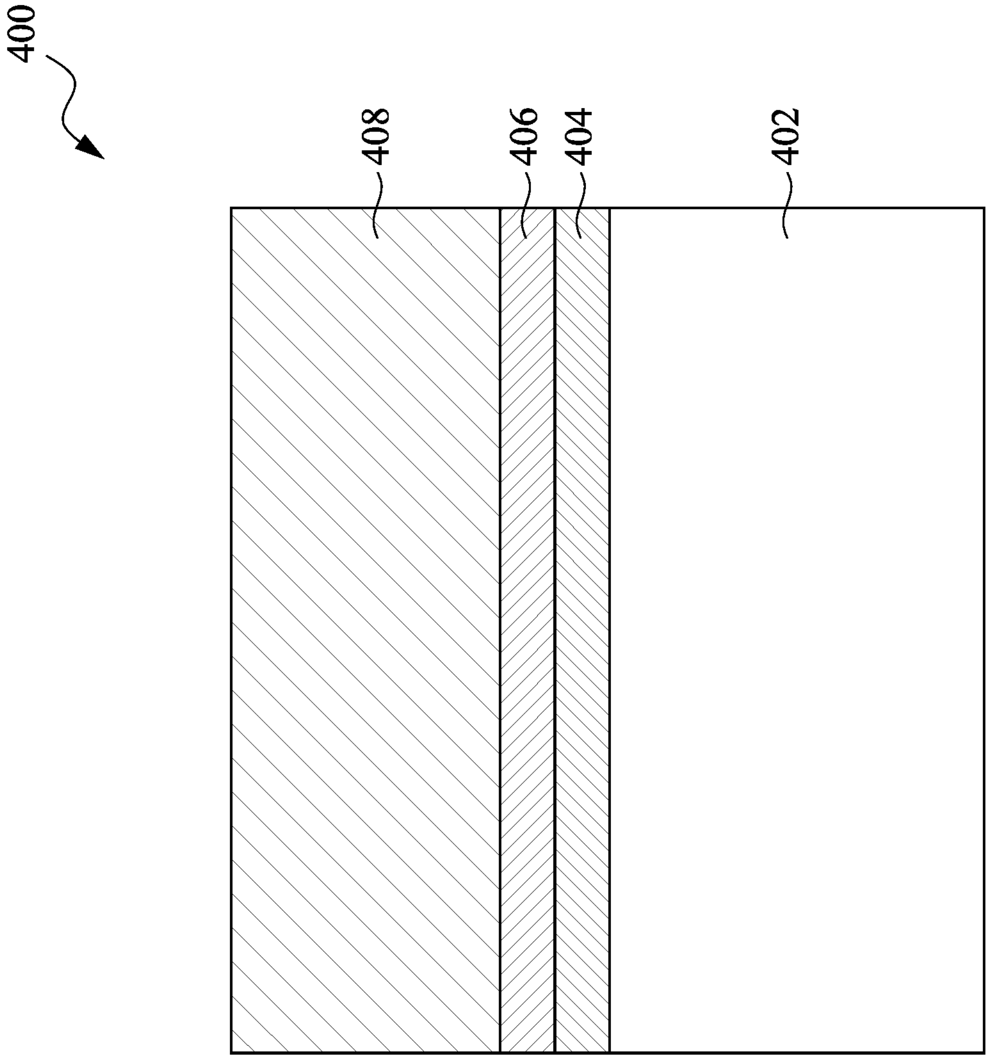
FIGS. 3-8 are diagrammatic cross-sectional side views of a semiconductor device at various stages of fabrication in accordance with some embodiments of the present disclosure.

Referring to FIG. 3, a semiconductor structure 400 includes a substrate 402. In an embodiment, the substrate 402 is a semiconductor substrate (e.g., wafer). In another embodiment, the substrate 402 includes silicon in a crystalline structure. In alternative embodiments, the substrate 402 includes other elementary semiconductors such as germanium, or a compound semiconductor such as silicon carbide, gallium arsenide, indium arsenide, and indium phosphide. The substrate 402 includes one or more layers of material or composition. The substrate 402 may include a silicon on insulator (SOI) substrate, be strained/stressed for performance enhancement, include epitaxial regions, include isolation regions, include doped regions, include one or more semiconductor devices or portions thereof, include conductive and/or non-conductive layers, and/or include other suitable features and layers.

In some embodiments, the structure 400 may be alternatively a photomask used to pattern a semiconductor wafer. In furtherance of the embodiments, the substrate 402 is a photomask substrate that may include a transparent material (such as quartz), or a low thermal expansion material such as silicon oxide-titanium oxide compound. The photomask substrate 402 may further include a material layer to be patterned. To further this example, the substrate 402 may be a photomask substrate for making a deep ultraviolet (DUV) mask, an extreme ultraviolet (EUV) mask, or other types of masks. Accordingly, an underlayer 404 is material layer to be patterned to define a circuit pattern. For example, the underlayer 404 is an absorber layer, such as chromium layer.

Afterwards, a photoresist layer (or simply resist layer) is formed over the substrate 402 (FIG. 3). In the present embodiment, a tri-layer resist scheme is implemented. Particularly, three material layers are respectively formed on the substrate 402, which are described below.

In some embodiments, a bottom layer (or bottom material layer or BL) 404, a middle layer (or middle material layer or ML) 406, and a first photoresist layer 408 are formed on the substrate 402 in sequence.

In the present example, the bottom layer 404 is a carbon-rich layer while the middle layer 406 is a silicon-rich layer designed to provide an etch selectivity between those two layers. The first photoresist layer 408 includes a chemical sensitive to the radiation applied by the corresponding lithography exposing process such that the photoresist layer is chemically or physically changed in response to the lithography exposing process such that portions (exposed or alternatively unexposed portions) of the resist layer are removed in a developer, thereby forming a patterned resist layer. In the tri-layer resist scheme, the photo-sensitive and etch-resistance functions of the photoresist are spread to those three layers, thus the photoresist layer can be designed differently (such as thinner) to enhance imaging resolution and lithography patterning quality.

In some embodiments, the bottom layer 404 is carbon-containing polymeric material formed on the substrate 402 by a proper technique, such as spin-on coating. Thus coated bottom layer 404 may be further cured, such as by baking. In various examples, the bottom layer 404 includes novolac resin. In other examples, the bottom layer 404 may alternatively include other material(s), such as silicon oxide, silicon nitride (SiN), silicon oxynitride, other suitable material, or a composition thereof.

The middle layer 406 is a silicon-rich material layer deposited on the bottom layer 404 by a proper technique, such as spin-on coating. The middle layer 406 is designed to have a composition different from the bottom layer 404 in order to have enough etch selectivity between those two layers.

According to the present disclosure, the middle layer 406 is designed to reduce the carbon concentration such that the silicon concentration of the middle layer is relatively increased.

Figure 4:
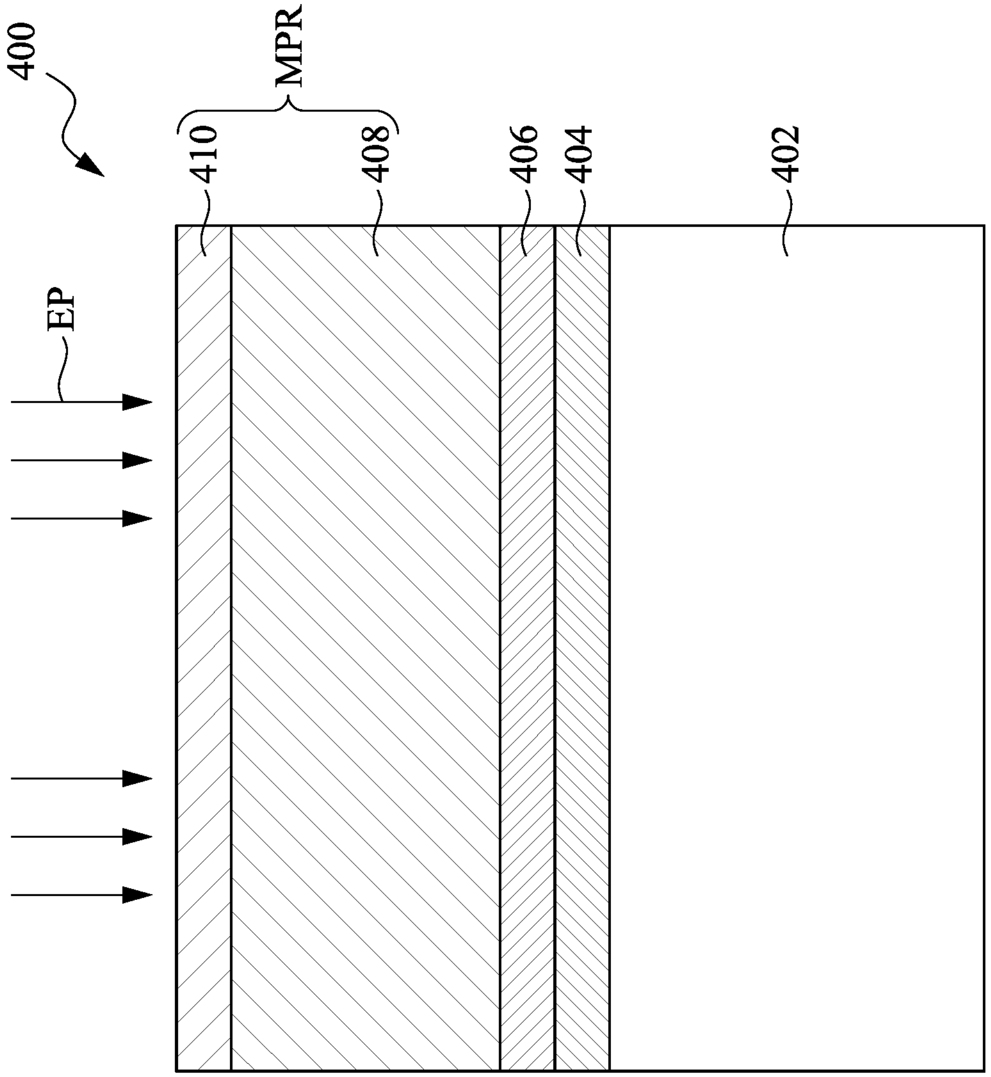

Reference is made to FIG. 4. A second photoresist layer 410 is formed on the first photoresist layer 408 to protect the underlying first photoresist layer 408. The second photoresist layer 410 and the first photoresist layer 408 collectively form a multilayer resist stack MPR. An exposure process EP is performed to expose the multilayer resist stack MPR to an EUV radiation. The exposure process EP applies the EUV radiation to an area of the multilayer resist stack MPR. The second photoresist layer 410 is less reactive to the hydrogen radicals, as explained in greater detail below. As a result, the second photoresist layer 410 is beneficial for preventing hydrogen radicals from reacting with the first photoresist layer 408. Therefore, the quality of the patterned multilayer resist stack MPR (see FIG. 5) can be enhanced. For example, lithography degradation, defect formation, which leads to degradation of LWR, or outgassing issues due to this reaction can be prevented. In some embodiments, the second photoresist layer 410 has a thickness different from a thickness of the first photoresist layer 408. For example, in an embodiment, the thickness of the second photoresist layer 410 is less than the thickness of the first photoresist layer 408.

The second photoresist layer 410 has a composition different from a composition of the first photoresist layer 408. The second photoresist layer 410 is not soluble to the first photoresist layer 408. For example, the second photoresist layer 410 includes a polymer (A-1) having a first functional group and a second functional group different from the first functional group, a photo acid generator (PAG) and a main solvent (B-1). The polymer (A-1) of the second photoresist layer 410 serves as a sacrificial component during the exposure process EP. For example, hydrocarbon compounds having the general formula $C_xH_y$, where x and y may be any integers, such as alkanes, alkenes, and alkynes, included in the polymer (A-1) can protect the second photoresist layer 410 from reacting with the radicals (e.g., the hydrogen radicals).

The polymer (A-1) and the PAG are soluble in the main solvent (B-1). That is, the polymer (A-1) and the PAG are dissolved in the main solvent (B-1). In some embodiments, a content of the polymer (A-1) is about 0.02 atomic percent (at %) to about 5 atomic percent (at %) based on a total content of the main solvent (B-1). A content of the PAG is about 1 at % to about 30 at % based on a total content of the polymer (A-1).

According to the acid generation mechanisms (by EUV light), multiple secondary electrons are excited from the sensitizer of the photoresist by the EUV photons. The energy of secondary electrons decays by thermal relaxation. Then the thermal electrons can be used by photo acid generators (PAG) and release proton acid.

In some embodiments, the PAG included in the second photoresist layer 410 contains a cation selected from a group consisting of cations represented by structural formulae (1) and (2) and an anion selected from the group consisting of anions represented by structural formulae (3) to (12):

Structural formula (1)

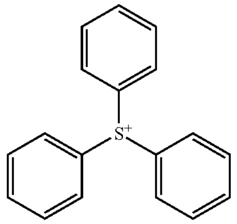

Structural formula (2)

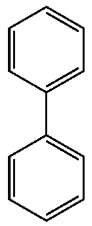

Structural formula (3)

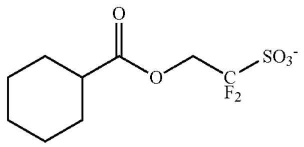

-continued

Structural formula (4)

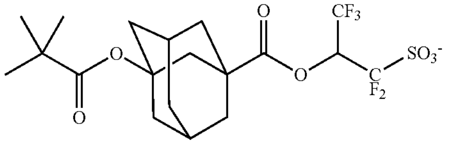

Structural formula (5)

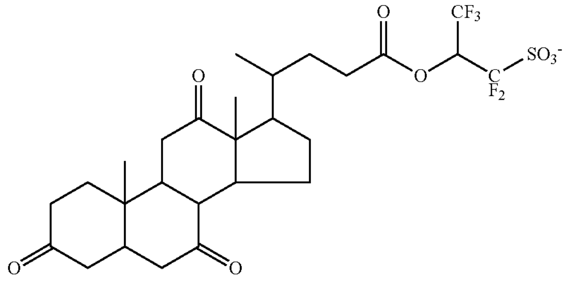

Structural formula (6)

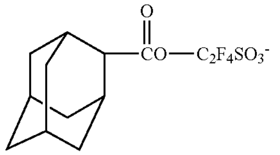

Structural formula (7)

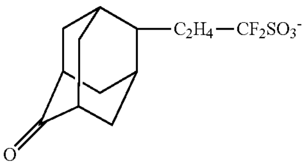

Structural formula (8)

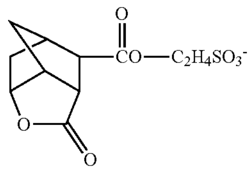

Structural formula (9)

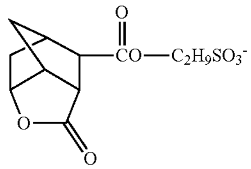

Structural formula (10)

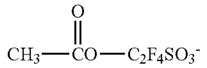

Structural formula (11)

$C_4F_9SO_3^-$

Structural formula (12)

$C_6F_{13}SO_3^-$.

The abovementioned thermal electrons can be used by photo decomposable bases (PDB) and release base as well. In some other embodiments, the second photoresist layer 410 has a photo decomposable base (PDB) to increase performance of the second photoresist layer 410. The PDB in the second photoresist layer 410 can be represented by a general formula (I)

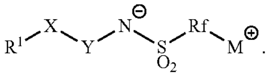

(I)

In the above formula (I), $R^1$ represents an alicyclic group of 5 or more carbon atoms which may have a substituent, X represents a divalent linking group, Y represents a linear, branched or cyclic alkylene group, or an arylene group, $N^-$ represents an anion, Rf represents a hydrocarbon group containing a fluorine atom, and $M^+$ represents an organic cation or a metal cation. For example, $M^+$ contains a cation selected from a group consisting of cations represented by structural formulae (13) and (14), and $N^-$ contains an anion selected from the group consisting of anions represented by structural formulae (15) to (20). In the structural formula (14), $R_1$ and $R_2$ represent a substituted or unsubstituted linear, branched, or cyclic alkyl group having 1 to 20 carbon atoms, respectively.

Structural formula(13)

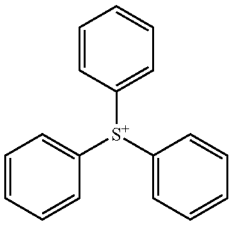

Structural formula(14)

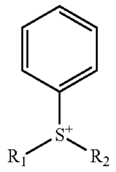

Structural formula(15)

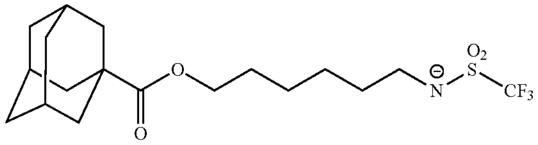

Structural formula(16)

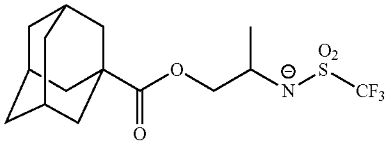

Structural formula(17)

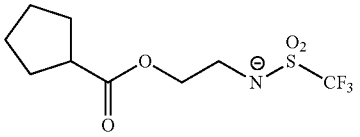

Structural formula(18)

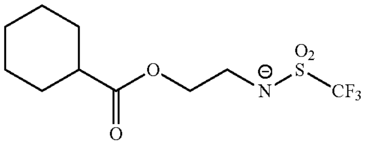

-continued

Structural formula(19)

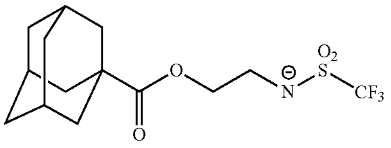

Structural formula(20)

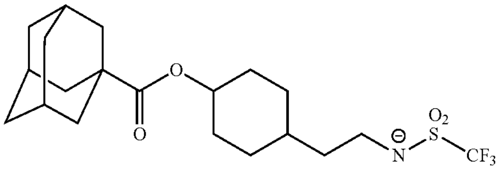

In some embodiments, a quencher is included in the second photoresist layer 410, constructed in accordance with some embodiments of the present disclosure. The quencher can be represented by structural formulae (21) to (32):

Structural formula (21)

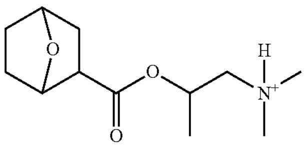

Structural formula (22)

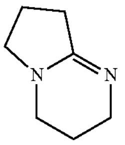

Structural formula (23)

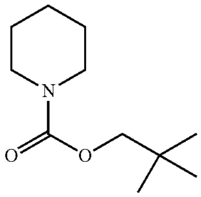

Structural formula (24)

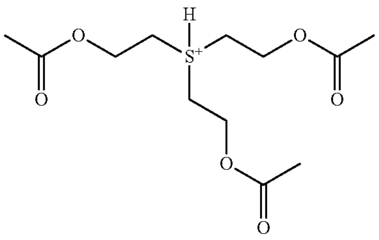

Structural formula (25)

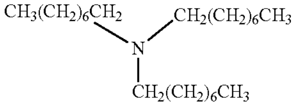

-continued

Structural formula (26)

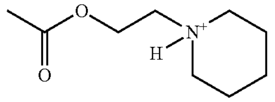

Structural formula (27)

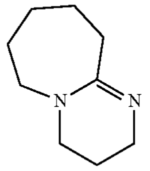

Structural formula (28)

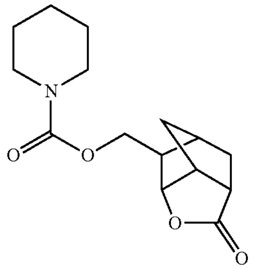

Structural formula (29)

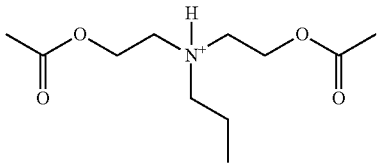

Structural formula (30)

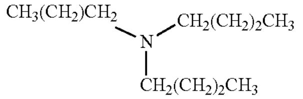

Structural formula (31)

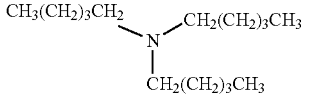

Structural formula (32)

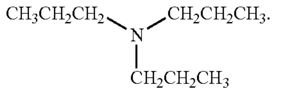

A content of the quencher or the PDB is about 0.1 at % to about 10 at % based on a total content of the polymer (A-1). In some embodiments, the first functional group of the polymer (A-1) of the second photoresist layer 410 is a cross-linker, and the second functional group of the polymer (A-1) of the second photoresist layer 410 is a solubility control unit. For the first functional group of the polymer (A-1) being the cross-linker, the second photoresist layer 410 can be cross-linked by the exposure process EP to protect the underlying first photoresist layer 408. In some embodiments where the first functional group of the polymer (A-1) is a cross-linker, and the second functional group of the polymer (A-1) is a solubility control unit, a content of the first functional group is about 15 at % to about 65 at % based on a total content of the polymer (A-1) while a content of the second functional group is about 35 at % to about 85% based on a total content of the polymer (A-1).

The main solvent (B-1) may have high polarity in some embodiments, in which the main solvent (B-1) has a boiling temperature of 60° C. to 280° C. and thus has a liquid state at mom temperature. For example, the main solvent (B-1) is alcohol, amide, amine in organic or aqueous phase. In some embodiments, the main solvent (B-1) may be propylene glycol monomethyl ether (PGME), 1-Ethoxy-2-propanol (PGEE), Gamma-Butyrolactone (GBL), Cyclohexanone (CHN), Ethyl lactate (EL), Methanol, Ethanol, Propanol, n-Butanol, Acetone, Dimethylformamide (DMF), Isopropyl alcohol (IPA), Tetrahydrofuran (THF), Methyl Isobutyl Carbinol (MIBC), n-butyl acetate (nBA), 2-heptanone (MAK), tetramethylammonium hydroxide (TMAH), Tetrabutylammonium hydroxide (TBAH), KOH, NaOH, HCl, HF or water.

In some other embodiments, the main solvent (B-1) has low polarity, in which the main solvent (B-1) has a boiling temperature of 60° C. to 280° C. and thus has a liquid state at room temperature. For example, the main solvent (B-1) is alkyl linear or branch type (e.g., Octane, 2-Methylheptane), or ether group (e.g., dipropyl ether, isoamyl ether).

By disposing the second photoresist layer 410 over the first photoresist layer 408, the multilayer resist stack MPR includes a pitch P1, defined as a sum of a width of patterned second photoresist layer (see FIG. 5) and a distance between adjacent patterned second photoresist layer of less than about 40 nm. The multilayer resist stack MPR can have a high pattern accuracy. For example, low LWR is achieved. The LWR can be less than 5.0 nm in an example. In some embodiments, the multilayer resist stack MPR can be patterned with extreme ultraviolet light at a low exposure dose, thereby saving cost. The exposure dose is of less than 80 $mJ/cm^2$ in an example. The multilayer resist stack MPR has an improvement of LWR of greater than 3% and an improvement of CDU of greater than 3%. An improvement of pulse energy of the operated laser may be greater than 3%. An improvement of the defect in the resist layer can be greater than 5%. A reduced amount of outgassing during bake can be greater than 5%. A mask print out window of the multilayer resist stack MPR can be enlarged (e.g., greater than 0.4 nm).

Figure 9:
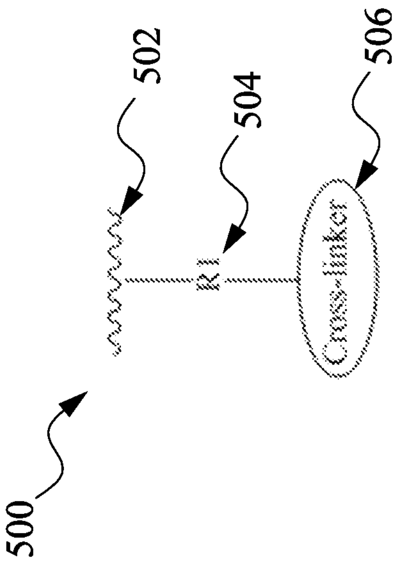
FIG. 9 shows an embodiment of a first component of the polymer included in the second photoresist layer, constructed in accordance with some embodiments of the present disclosure.

FIG. 9 shows an embodiment of a first component 500 of the polymer (A-1) included in the second photoresist layer 410, constructed in accordance with some embodiments of the present disclosure. The first component 500 of the polymer (A-1) includes a polymer backbone 502 and a cross-linker 506 bonded to the polymer backbone 502 through an intermediate bonding unit 504. The intermediate bonding unit 504 is unbranched or branched, cyclic or noncyclic saturated 1 to 9 carbon units with hydrogen or halogen. In some embodiments, the intermediate bonding unit 504 include alky group, alkene group, —S— unit, —P— unit; —P($O_2$)— unit, —C(═O)S— unit, —C(═O)O— unit, —O— unit, —N— unit, —C(═O)N— unit, —$SO_2$O— unit, —$SO_2$S unit, —SO— unit, —$SO_2$— unit, carboxylic acid, ether, ketone, ester, or benzene unit.

Figure 10:
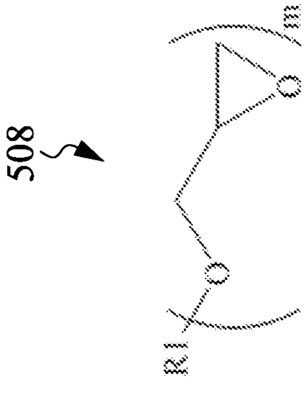
FIGS. 10-12 show embodiments of cross-linker with various chemical structures bonding to the intermediate bonding unit.
Figure 11:
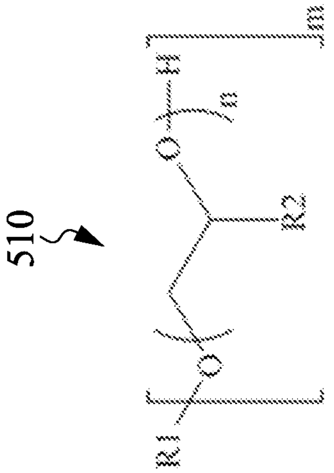
Figure 12:
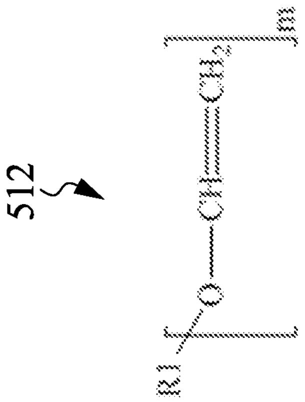

The carbon atom in the polymer backbone 502 and in the cross-linker 506 could be substituted by a silicon atom. FIGS. 10-12 show embodiments of cross-linker 506 with various chemical structures bonding to the intermediate bonding unit 504. The cross-linker 506, for example, has a chemical structure 508, a chemical structure 510 or a chemical structure 512 illustrated in FIGS. 10-12 bonding to the intermediate bonding unit 504, respectively, in which m and n are integers in a range from 1 to 6.

Figure 13:
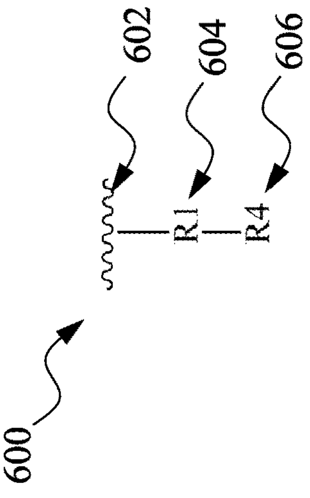
FIG. 13 shows an embodiment of second component of the polymer included in the second photoresist layer, constructed in accordance with some embodiments of the present disclosure.
Figure 14:
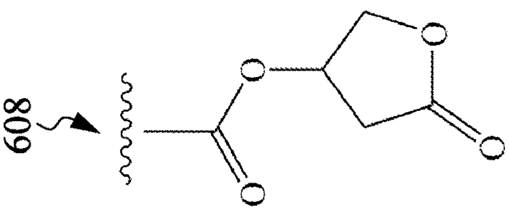
FIGS. 14-19 show embodiments of the second component where the intermediate bonding unit is —C(═O)O—, constructed in accordance with some embodiments of the present disclosure.
Figure 15:
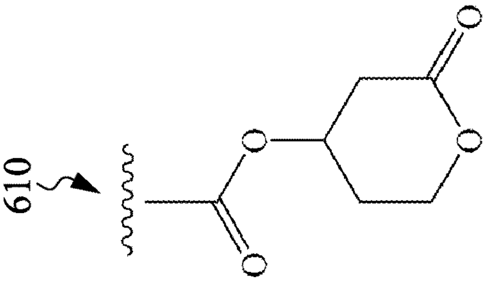
Figure 16:
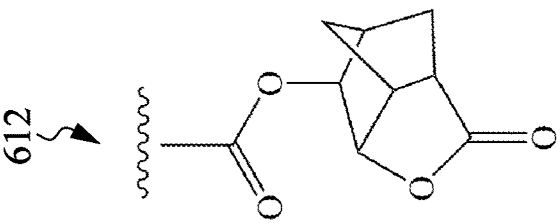
Figure 17:
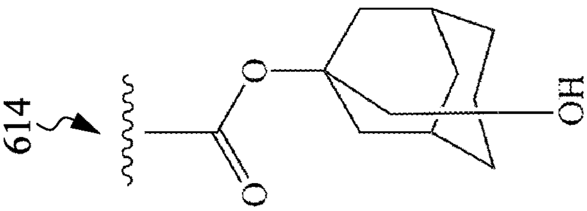
Figure 18:
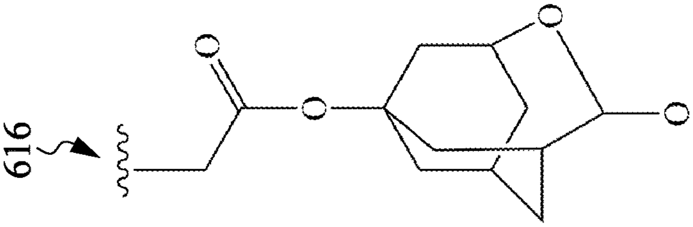
Figure 19:
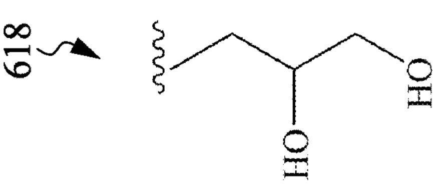

FIG. 13 shows an embodiment of a second component 600 of the polymer (A-1) included in the second photoresist layer 410, constructed in accordance with some embodiments of the present disclosure. The second component 600 of the polymer (A-1) includes a polymer backbone 602 and a solubility control unit 606 bonded to the polymer backbone 602 through an intermediate bonding unit 604. The solubility control unit 606 is used for increasing solubility of the polymer (A-1) to the main solvent (B-1) having high polarity. The intermediate bonding unit 604 is unbranched or branched, cyclic or noncyclic saturated 1 to 9 carbon units with hydrogen or halogen. In some embodiments, the intermediate bonding unit 604 include alky group, alkene group, —S— unit, —P— unit; —$P(O_2)$— unit, —C(═O)S— unit, —C(═O)O— unit, —O— unit, —N— unit, —C(═O)N— unit, —$SO_2O$— unit, —$SO_2S$ unit, —SO— unit, —$SO_2$— unit, carboxylic acid, ether, ketone, ester, or benzene unit.

The carbon atom in the polymer backbone 602 and in the solubility control unit 606 could be substituted by a silicon atom. FIGS. 14-19 show embodiments of the second component 600 where the intermediate bonding unit 604 is —C(═O)O—, constructed in accordance with some embodiments of the present disclosure. In some embodiments where the intermediate bonding unit 604 is —C(═O)O—, the second component 600, for example, has a chemical structure 608, a chemical structure 610, a chemical structure 612, a chemical structure 614, a chemical structure 616 or a chemical structure 618, illustrated in FIGS. 14-19, respectively. In some embodiments, the solubility control unit 606 is unbranched or branched, cyclic or noncyclic carboxylic acid, ether, ketone, ester or alcohol unit. In some embodiments, the solubility control unit 606 has a carbon number of less than 25.

Figure 20:
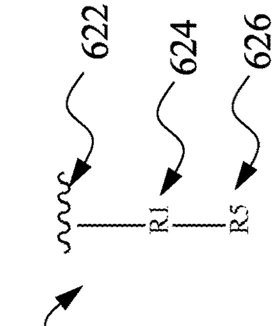
FIG. 20 shows another embodiment of the second component of the polymer included in the second photoresist layer, constructed in accordance with some embodiments of the present disclosure.
Figure 21:
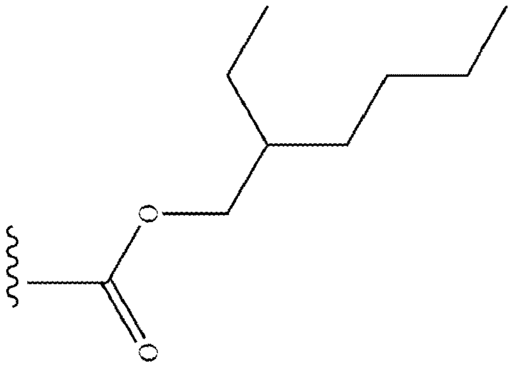
FIGS. 21-26 show embodiments of the second component where the intermediate bonding unit is —C(═O)O—, constructed in accordance with some embodiments of the present disclosure.
Figure 22:
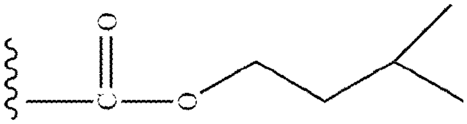
Figure 23:
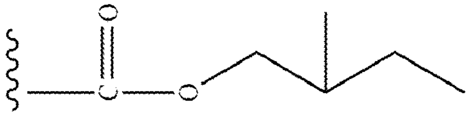
Figure 24:
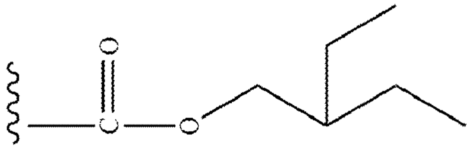
Figure 25:
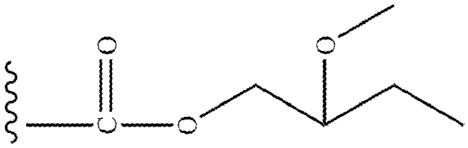
Figure 26:
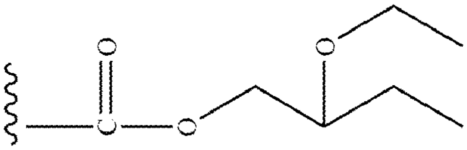

FIG. 20 shows another embodiment of the second component 620 of the polymer (A-1) included in the second photoresist layer 410, constructed in accordance with some embodiments of the present disclosure. The second component 620 includes a polymer backbone 622 and a solubility control unit 626 bonded to the polymer backbone 622 through an intermediate bonding unit 624. The solubility control unit 626 is used for increasing the solubility of the second photoresist layer 410 to the main solvent (B-1) having low polarity. The intermediate bonding unit 624 is unbranched or branched, cyclic or noncyclic saturated 1 to 9 carbon units with hydrogen or halogen. In some embodiments, the intermediate bonding unit 624 include alky group, alkene group, —S— unit, —P— unit; —$P(O_2)$— unit, —C(═O)S— unit, —C(═O)O— unit, —O— unit, —N— unit, —C(═O)N— unit, —$SO_2O$— unit, —$SO_2S$ unit, —SO— unit, —$SO_2$— unit, carboxylic acid, ether, ketone, ester, or benzene unit.

The carbon atom in the polymer backbone 622 and in the solubility control unit 626 could be substituted by a silicon atom. FIGS. 21-26 show embodiments of the second component where the intermediate bonding unit is —C(═O)O—, constructed in accordance with some embodiments of the present disclosure. In some embodiments where the intermediate bonding unit 624 is —C(═O)O—, the second component 620, for example, has a chemical structure 628, a chemical structure 630, a chemical structure 632, a chemical structure 634, a chemical structure 636 or a chemical structure 638, illustrated in FIGS. 21-26, respectively. In some embodiments, the solubility control unit 626 is unbranched or branched, cyclic or noncyclic alkyl, ether or ester unit. In some embodiments, the solubility control unit 626 has a carbon number of less than 25.

Figure 5:
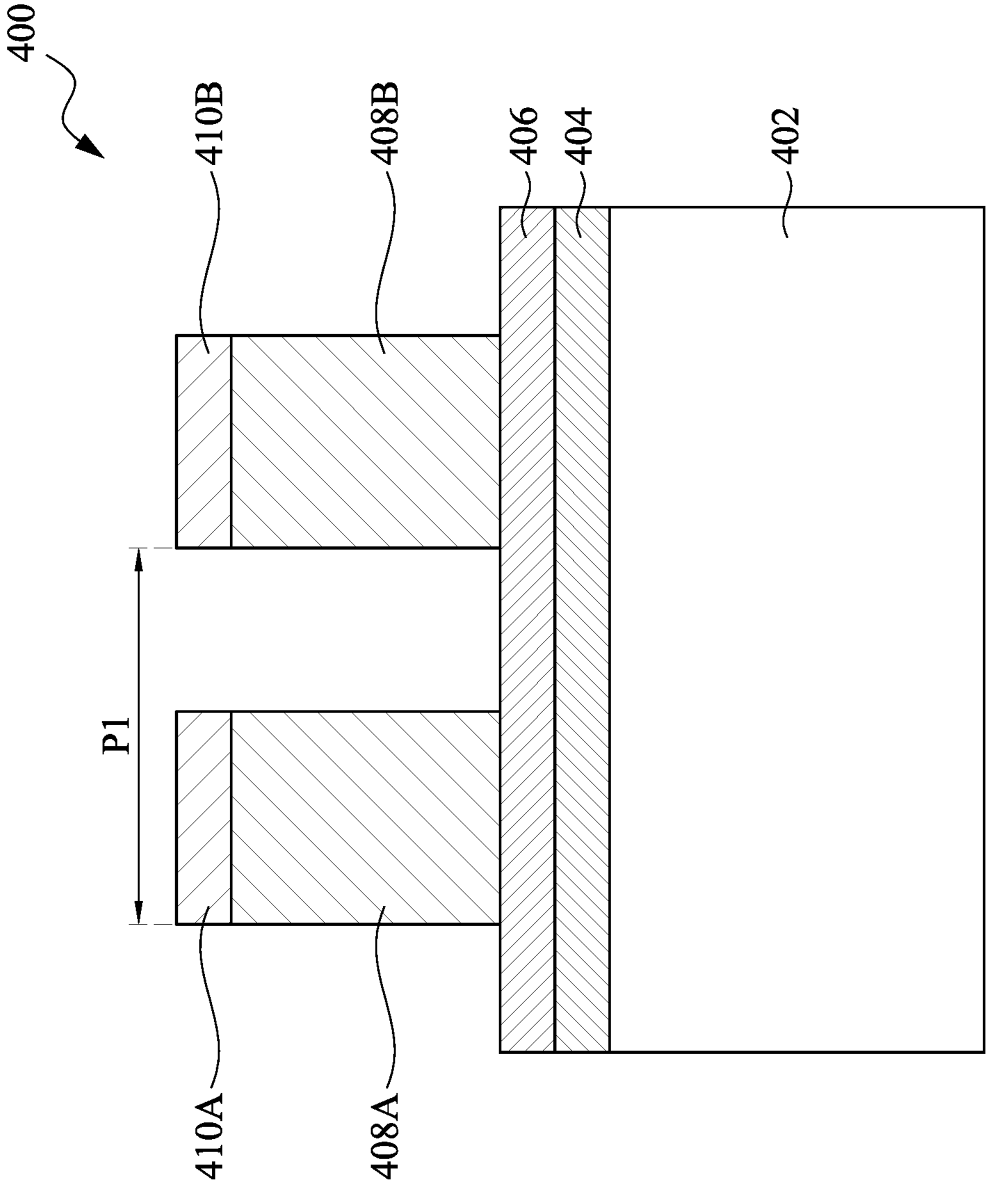

Referring now to FIG. 5, the exposed multilayer resist stack MPR is developed. For example, subsequent lithography processes (e.g., post-exposure baking, developing, rinsing, etc.) may be performed to form a patterned multilayer resist stack, which for the sake of simplicity is illustrated herein as first resist segments 408A and 408B and second resist segments 410A and 410 B separated by a recess, respectively.

Figure 6:
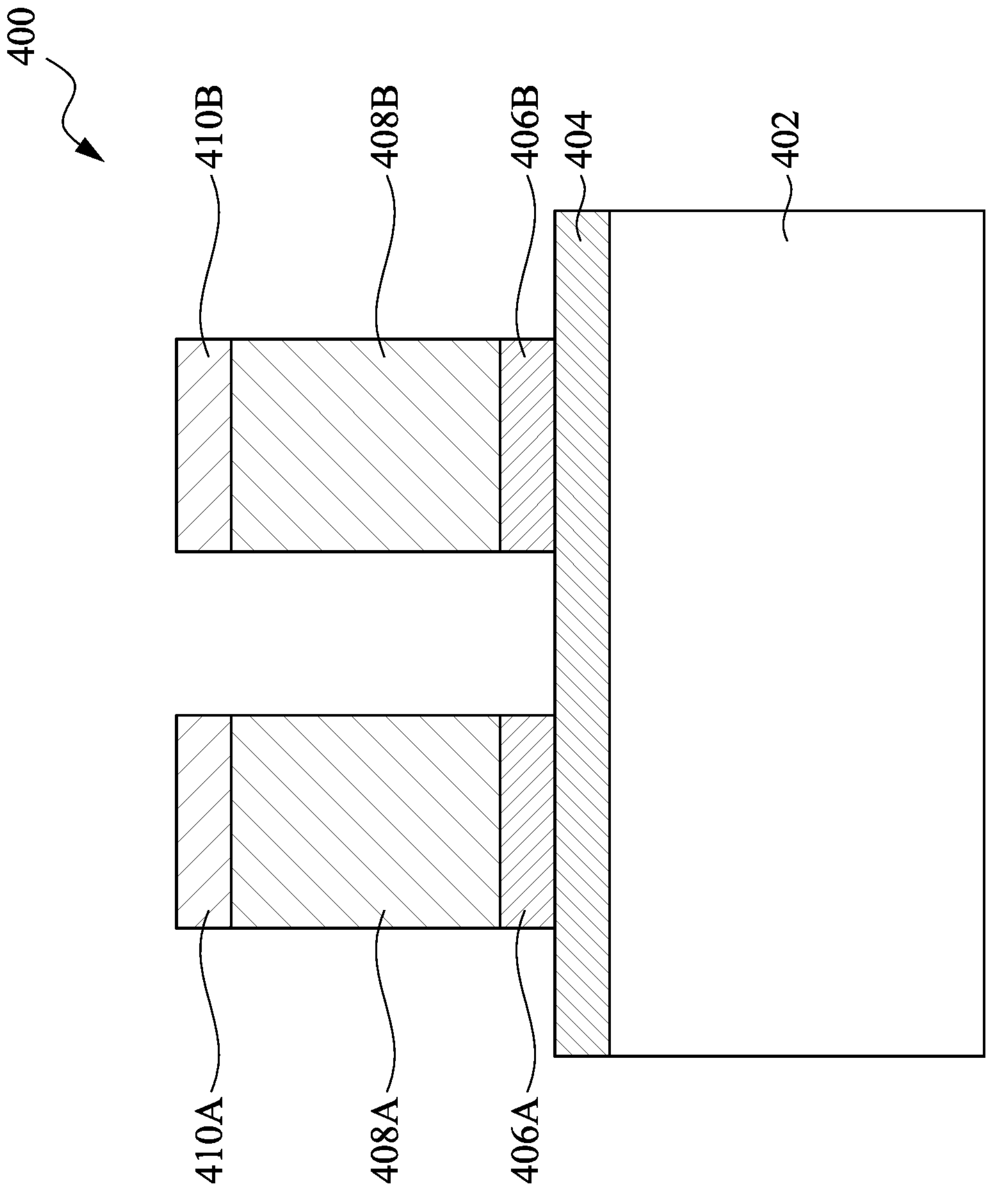

Reference is made to FIG. 6. A first etching process is performed to the middle layer 406 using the first resist segments 408A, 4088 and the second resist segments 410A, 410B as an etch mask, thereby transforming the circuit pattern from the first resist segments 408A, 408B and the second resist segments 410A, 410B to the middle layer 406, thus forming patterned middle layers 406A, 406B. The first etching process is designed with an etchant to selectively etch the middle layer 406 but stops on the bottom layer 404. The first etching process may be a dry etch, a wet etch or a combination thereof. After the first etching process, the first resist segments 408A and 408B and the second resist segments 410A and 410 B are removed by wet stripping or plasma ashing, as illustrated in FIG. 7.

Figure 7:
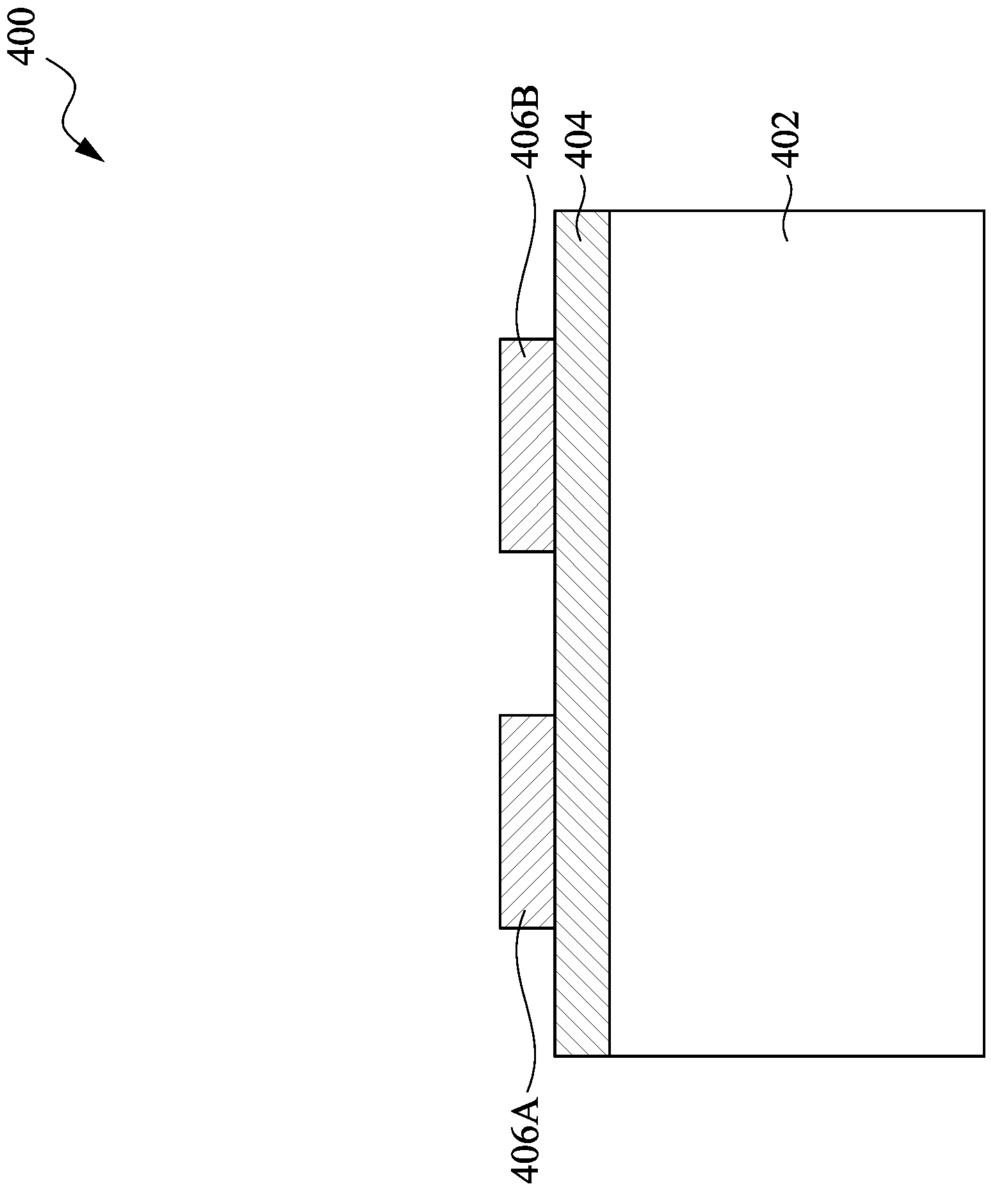
Figure 8:
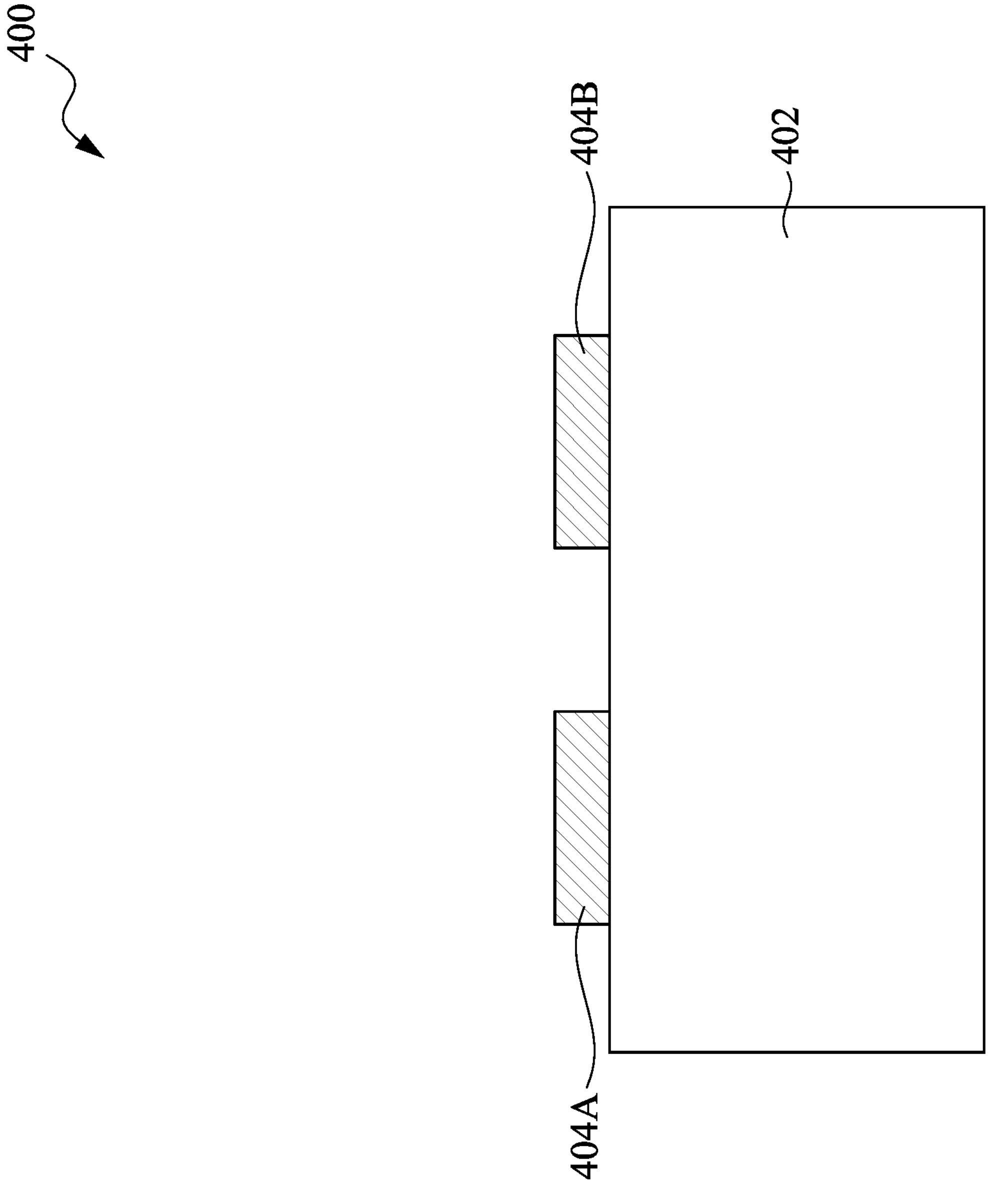

Reference is made to FIG. 7. A second etching process is performed to the bottom layer 404 using the patterned middle layers 406A, 406B as an etch mask, thereby transforming the circuit pattern from the patterned middle layers 406A, 406B to the bottom layer 404, forming patterned bottom layers 404A, 404B (see FIG. 8). The second etching process is designed with an etchant to selectively etch the bottom layer 404 without significant removal of the patterned middle layers 406A, 406B due to the etching selectivity between the middle layer 406 and the bottom layer 404. The second etching process may be a dry etch, a wet etch or a combination thereof. After the second etching process, the patterned middle layers 406A, 406B may be removed by a proper technique, such as wet etching.

Other operations may be performed after removing the patterned middle layers 406A, 406B. For example, a fabrication process is performed to the semiconductor structure 400 using the patterned bottom layers 404A, 404E as a mask such that the fabrication process is only applied to the portions of the semiconductor structure 400 within the openings of the patterned bottom layers 404A, 404B while other portions covered by the patterned bottom layers 404A, 404B are protected from being impacted by the fabrication process. In some embodiments, the fabrication process includes an etching process applied to the substrate 402, such as an underlying material layer using the patterned bottom layers 404A, 404B as an etch mask, thereby transferring the pattern from the patterned bottom layer 404A, 404B to the underlying material layer. In alternative embodiments, the fabrication process includes an ion implantation process applied to the semiconductor structure 400 using the patterned bottom layers 404A, 404B as an implantation mask, thereby forming various doped features in the semiconductor structure 400.

In some examples, the underlying material layer is a semiconductor material layer, a conductive material layer or a dielectric material layer. To further this embodiment, the pattern is transferred from the patterned bottom layers 404A, 404B to the underlying material layer by etch or ion implantation.

Although the discussions above use EUV lithography as an example, it is understood that the various aspects of the photoresist (e.g., the multilayer resist stack) may apply to other types of lithography as well, such as an e-beam lithography.

Based on the above discussions, it can be seen that the present disclosure offers advantages over conventional methods. It is understood, however, that other embodiments may offer additional advantages, and not all advantages are necessarily disclosed herein, and that no particular advantage is required for all embodiments. One advantage is that the upper resist layer of the multilayer resist stack is less reactive to the hydrogen radicals in the hydrogen gas ambient in the EUV tools, and thus can protect the lower resist layer. And hence that the quality (e.g., the line width roughness (LWR), the CDU) of the patterned photoresist can be improved. Another advantage is that the outgassing during bake can have a reduced amount. Yet another advantage is that a pulse energy of the operated laser can be reduced, thereby saving cost.

In some embodiments, a method of manufacturing a semiconductor device includes forming a multilayer photoresist stack over a substrate, in which the multilayer photoresist stack has a first photoresist layer and a second photoresist layer over the first photoresist layer, and the second photoresist layer is less reactive to hydrogen than the first photoresist layer, exposing the multilayer photoresist stack to an EUV radiation, and developing the exposed multilayer photoresist stack. In some embodiments, the second photoresist layer includes a first component having a cross-linker, a second component having a solubility control unit and a solvent. The first component and the second component are dissolved in the solvent. In some embodiments, the second component further includes a polymer backbone and an intermediate bonding unit being —C(═O)O—. The solubility control unit is bonded to the polymer backbone through the intermediate bonding unit. The intermediate bonding unit and the solubility control unit collectively form one of the following chemical structures:

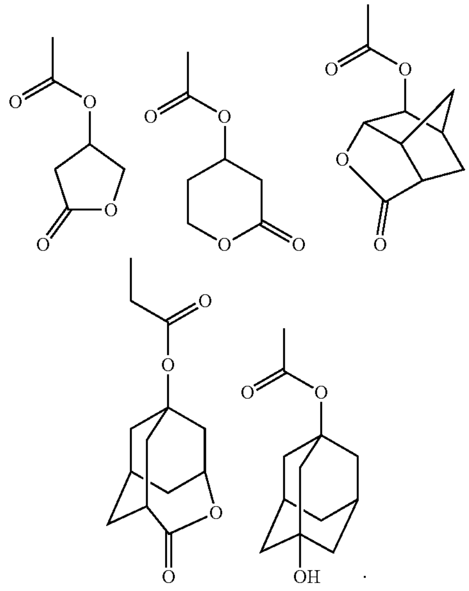

In some embodiments, the solvent is selected from the group consisting of propylene glycol monomethyl ether (PGME), 1-Ethoxy 2-propanol (PGEE), Gamma-Butyrolactone (GBL), Cyclohexanone (CHN), Ethyl lactate (EL), Methanol, Ethanol, Propanol, n-Butanol, Acetone, Dimethylformamide (DMF), Isopropyl alcohol (IPA), Tetrahydrofuran (THF), Methyl Isobutyl Carbinol (MIBC), n-butyl acetate (nBA), 2-heptanone (MAK), tetramethylammonium hydroxide (TMAH), Tetrabutylammonium hydroxide (TBAH), KOH, NaOH, HCl, HF, and water. In some embodiments, the second component further includes a polymer backbone and an intermediate bonding unit. The solubility control unit is bonded to the polymer backbone through the intermediate bonding unit, and the intermediate bonding unit and the solubility control unit collectively fort the following chemical structure:

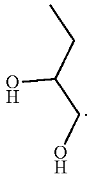

In some embodiments, the second component further includes an intermediate bonding unit being —C(═O)O— and a polymer backbone. The solubility control unit is bonded to the polymer backbone through the intermediate bonding unit, and the solubility control unit is one of the following chemical structures:

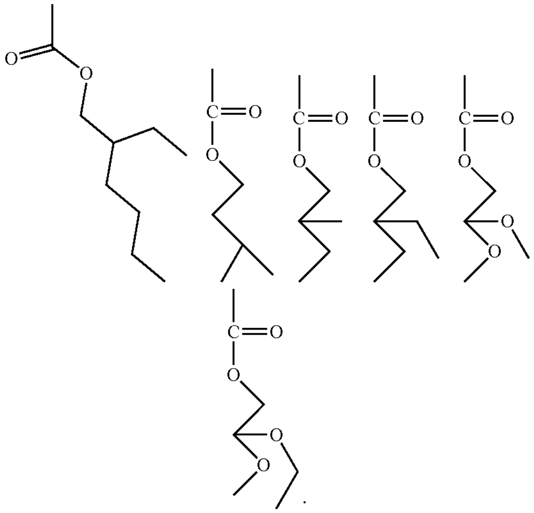

In some embodiments, the solvent is selected from the group consisting of octane, 2-methylheptane, dipropyl ether and isoamyl ether. In some embodiments, a sum of a content of the first component and a content of the second component are about 0.02 atomic percent (at %) to about 5 atomic percent (at %) based on a total content of the solvent. In some embodiments, the intermediate bonding unit comprises alky group, alkene group, —S— unit, —P— unit; —$P(O_2)$— unit, —C(═O)S— unit, —C(═O)O— unit, —O— unit, —N— unit, —C(═O)N— unit, —$SO_2O$— unit, —$SO_2S$ unit, —SO— unit, —$SO_2$— unit, carboxylic acid, ether, ketone, ester, or benzene unit.

In some embodiments, an extreme ultraviolet lithography (EUVL) method includes turning on a droplet generator to eject a metal droplet toward a zone of excitation in front of a collector, turning on a laser source to emit a laser toward the zone of excitation, such that the metal droplet is heated by the laser to generate EUV radiation, guiding the EUV radiation, by using one or more first optics, toward a reflective mask in an exposure device, and guiding the EUV radiation, by using one or more second optics, reflected from the reflective mask toward a multilayer photoresist stack coated substrate in the exposure device. The multilayer photoresist stack includes a lower photoresist layer and an upper photoresist layer on the lower photoresist layer and being less reactive to hydrogen than the lower photoresist layer. In some embodiments, the upper photoresist layer includes a solvent and a polymer dissolved in the solvent. The solvent includes propylene glycol monomethyl ether (PGME), 1-Ethoxy-2-propanol (PGEE), Gamma-Butyrolactone (GBL), Cyclohexanone (CHN), Ethyl lactate (EL), Methanol, Ethanol, Propanol, n-Butanol, Acetone, Dimethylformamide (DMF), Isopropyl alcohol (IPA), Tetrahydrofuran (THF), Methyl Isobutyl Carbinol (MIBC), n-butyl acetate (nBA), 2-heptanone (MAK), tetramethylammonium hydroxide (TMAH), Tetrabutylammonium hydroxide (TBAH), KOH, NaOH, HCl, HF or water. In some embodiments, the upper photoresist layer includes a solvent and a polymer dissolved in the solvent. The solvent includes octane, 2-Methylheptane, dipropyl ether or isoamyl ether. In some embodiments, the upper photoresist layer includes a photo acid generator (PAG) containing a cation selected from the group consisting of cations represented by structural formulae (1) and (2):

Structural formula (1)

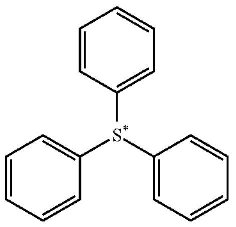

Structural formula (2)

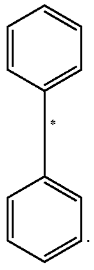

In some embodiments, the PAG further contains an anion selected from the group consisting of anions represented by structural formulae (3) to (12):

Structural formula (3)

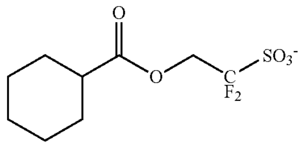

Structural formula (4)

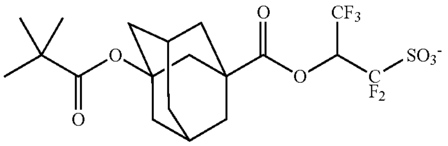

-continued

Structural formula (5)

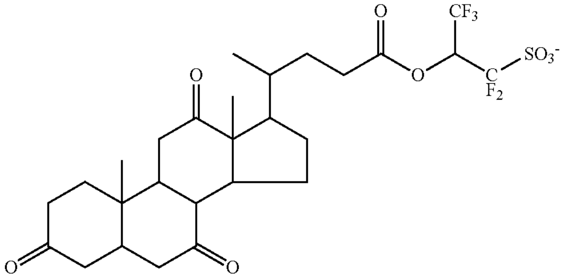

Structural formula (6)

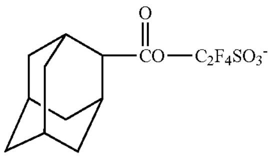

Structural formula (7)

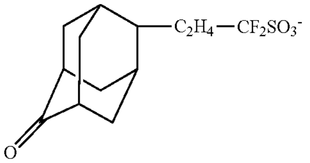

Structural formula (8)

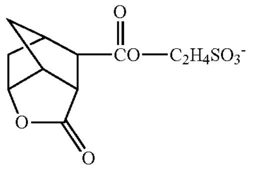

Structural formula (9)

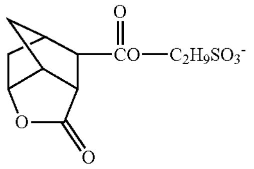

Structural formula (10)

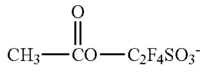

Structural formula (11)

$C_4F_9SO_3^-$

Structural formula (12)

$C_6F_{13}SO_3^-$.

In some embodiments, a multilayer photoresist stack includes a lower photoresist layer and an upper photoresist layer over the lower photoresist layer. The upper photoresist layer is less reactive to hydrogen than the lower photoresist layer and includes a solvent and a polymer dissolved in the solvent. The polymer includes a first component and hydrocarbon compounds having the general formula $C_xH_y$). The first component includes a polymer backbone and a cross-linker bonded to the polymer backbone through an intermediate bonding unit. In some embodiments, the lower photoresist layer has a composition different from a composition of the upper photoresist layer. In some embodiments, the upper photoresist layer further includes a second component including a solubility control unit. In some embodiments, the cross-linker is one of the following:

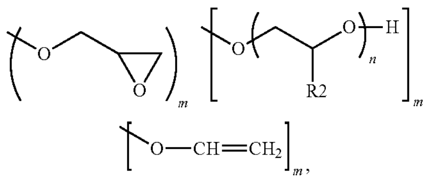

R2 represents a substituted or unsubstituted linear, branched, or cyclic alkyl group having 1 to 20 carbon atoms, and m and n are integers in a range from 1 to 6. In some embodiments, a content of the cross-linker of the first component of the polymer is about 15 atomic percent (at %) to about 65 atomic percent (at %) based on a total content of the polymer. In some embodiments, the intermediate bonding unit comprises alky group, alkene group, —S— unit, —P— unit; —$P(O_2)$— unit, —C(=O)S— unit, —C(=O)O— unit, —O— unit, —N— unit, —C(=O)N— unit, —$SO_2O$— unit, —$SO_2S$ unit, —SO— unit, —$SO_2$— unit, carboxylic acid, ether, ketone, ester, or benzene unit.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:

forming a multilayer photoresist stack over a substrate, wherein the multilayer photoresist stack has a first photoresist layer and a second photoresist layer over the first photoresist layer, and the second photoresist layer is less reactive to hydrogen radicals than the first photoresist layer, and wherein the second photoresist layer comprises:

a first component having a cross-linker;

a second component having a solubility control unit, wherein the second component further comprises:

a polymer backbone; and an intermediate bonding unit, the solubility control unit is bonded to the polymer backbone through the intermediate bonding unit, and the intermediate bonding unit and the solubility control unit collectively form the following chemical structure:

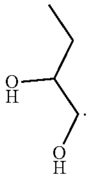

a solvent, wherein the first component and the second component are dissolved in the solvent, the solvent is in aqueous phase; and a photo acid generator (PAG) containing a cation consisting of:

Structural formula (2)

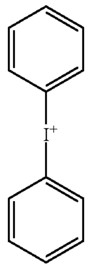

and an anion consisting of:

Structural formula (4)

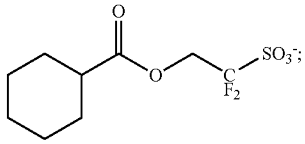

exposing the multilayer photoresist stack to an EUV radiation; and performing a developing step to develop both of the first photoresist layer and the second photoresist layer of the exposed multilayer photoresist stack such that the first photoresist layer forms separated first resist segments and the second photoresist layer forms separated second resist segments.

2. The method of claim 1, wherein the solvent is selected from the group consisting of tetramethylammonium hydroxide (TMAH), Tetrabutylammonium hydroxide (TBAH), KOH, NaOH, HCL, HF, and water.

3. The method of claim 1, wherein a sum of a content of the first component and a content of the second component are about 0.02 atomic percent (at %) to about 5 atomic percent (at %) based on a total content of the solvent.

4. An extreme ultraviolet lithography (EUVL) method, comprising:

turning on a droplet generator to eject a metal droplet toward a zone of excitation in front of a collector;

turning on a laser source to emit a laser toward the zone of excitation, such that the metal droplet is heated by the laser to generate EUV radiation;

guiding the EUV radiation, by using one or more first optics, toward a reflective mask in an exposure device; and guiding the EUV radiation, by using one or more second optics, reflected from the reflective mask toward a multilayer photoresist stack coated substrate in the exposure device, wherein the multilayer photoresist stack comprises:

a lower photoresist layer; and an upper photoresist layer on the lower photoresist layer and being less reactive to hydrogen radicals than the lower photoresist layer, and wherein the upper photoresist layer comprises:

a first component having a cross-linker;

a second component having a solubility control unit, wherein the second component further comprises:

a polymer backbone; and an intermediate bonding unit, the solubility control unit is bonded to the polymer backbone through the intermediate bonding unit, and the intermediate bonding unit and the solubility control unit collectively form the following chemical structure:

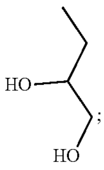

;

a solvent, wherein the first component and the second component are dissolved in the solvent, the solvent comprises tetramethylammonium hydroxide (TMAH), Tetrabutylammonium hydroxide (TBAH), KOH, NaOH, HCL, HF, or water, and wherein guiding the EUV radiation, by using one or more second optics, reflected from the reflective mask toward the multilayer photoresist stack coated substrate in the exposure device is performed such that the lower photoresist layer and the upper photoresist layer are developable in a same developing steps; and a photo acid generator (PAG) containing a cation consisting of:

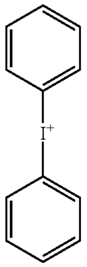 [SMILES: c1ccc([I+]c2ccccc2)cc1]

Structural formula (2) and an anion selected from the group consisting of anions represented by structural formulae (3) to (10) and (12):

Structural formula (3)

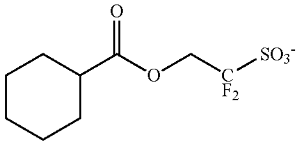

Structural formula (4)

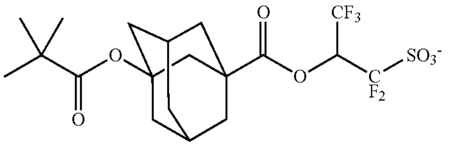

-continued

Structural formula (5)

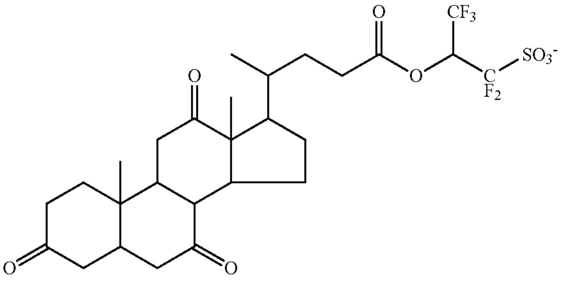

Structual formula (6)

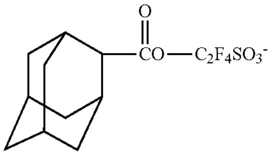

Structual formula (7)

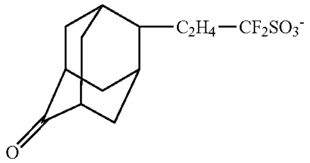

Structual formula (8)

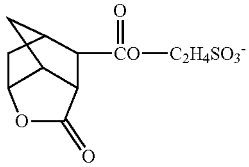

Structual formula (9)

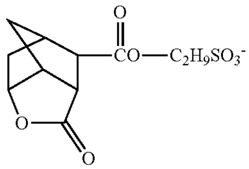

Structural formula (10)

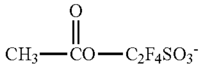

Structural formula (11)

$C_4F_9SO_3^-$

Structural formula (12)

$C_6F_{13}SO_3^-$.

5. A method for lithography patterning, comprising:

forming a first photoresist layer over a substrate;

forming a second photoresist layer over the first photoresist layer, wherein the second photoresist layer has a composition different from a composition of the first photoresist layer, and wherein:

the second photoresist layer comprises:

a solvent;

a polymer dissolved in the solvent, wherein the polymer comprises:

a first component includes a polymer backbone and a cross-linker bonded to the polymer backbone through an intermediate bonding unit, wherein a content of the cross-linker of the first component of the polymer is about 15 atomic percent (at %) to about 65 atomic percent (at %) based on a total content of the polymer; and a photo acid generator (PAG) containing a cation consisting of:

Structural formula (2)

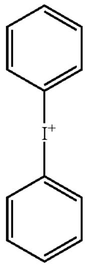

and an anion selected from the group consisting of anions represented by structural formulae (3) to (10) and (12):

Structural formula (3)

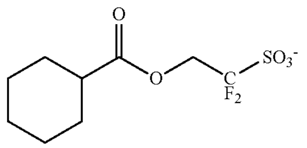

Structural formula (4)

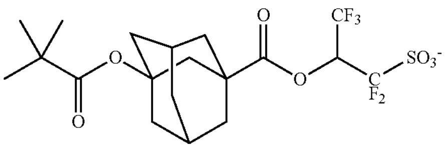

Structural formula (5)

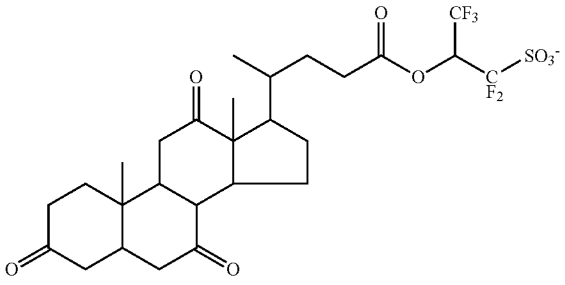

Structural formula (6)

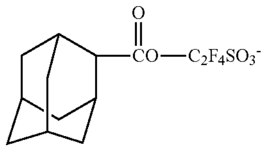

Structural formula (7)

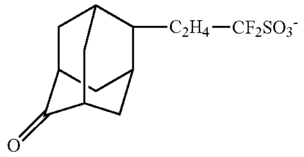

Structural formula (8)

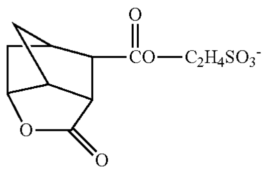

-continued

Structural formula (9)

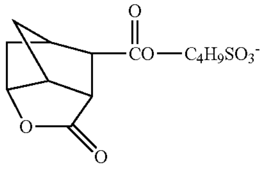

Structural formula (10)

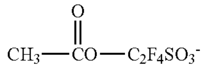

Structural formula (12)

$C_6F_{13}SO_3^-$;

and the polymer of the second photoresist layer further comprises:

a second component comprises a solubility control unit, the solubility control unit comprises an ester group directly bonded to a —$CH_2CH$— group, the $CH_2CH$ group directly bonded to two ether groups, the solubility control unit is selected from the group consisting of the following chemical structures:

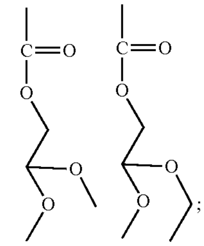

;

irradiating the first photoresist layer and the second photoresist layer with an EUV radiation;

developing the first photoresist layer and the second photoresist layer in a single developing step such that the first photoresist layer forms separated first resist segments and the second photoresist layer forms separated second resist segments; and etching the substrate using the first photoresist layer and the second photoresist layer as an etch mask.

6. The method of claim 5, wherein the cross-linker is one of the following:

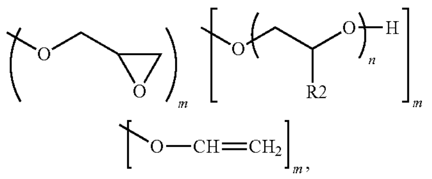

R2 represents a substituted or unsubstituted linear, branched, or cyclic alkyl group having 1 to 20 carbon atoms, and m and n are integers in a range from 1 to 6.

7. The method of claim 5, wherein the intermediate bonding unit comprises alky group, alkene group, —S-unit, —P-unit; —$P(O_2)$-unit, —C(═O)S-unit, —C(═O)O-unit, —O-unit, —N-unit, —C(—O)N-unit, —$SO_2$O-unit, —$SO_2$S unit, —SO-unit, —$SO_2$-unit, carboxylic acid, ether, ketone, ester, or benzene unit.

8. The method of claim 1, wherein the second photoresist layer further comprises:

a quencher, and a content of the quencher is about 0.1 atomic percent (at %) to about 10 atomic percent (at %) based on a total content of the first component and the second component.

9. The method of claim 1, wherein the second photoresist layer further comprises:

a photo acid generator (PAG), and a content of the PAG is about 1 atomic percent (at %) to about 30 atomic percent (at %) based on a total content of the first component and the second component.

10. The method of claim 1, wherein the solvent has a boiling temperature of about 60° C. to about 280° C.

11. The method of claim 1, wherein the first photoresist layer has a thickness different from a thickness of the second photoresist layer.

12. The method of claim 1, wherein the second photoresist layer has a thickness less than a thickness of the first photoresist layer.

13. The method of claim 5, wherein the second photoresist layer has a thickness less than a thickness of the first photoresist layer.

14. The method of claim 5, wherein the first photoresist layer has a thickness different from a thickness of the second photoresist layer.

15. The method of claim 1, further comprising:

prior to forming the multilayer photoresist stack over the substrate, forming a carbon-rich material layer over the substrate; and forming a silicon-rich material layer over the carbon-rich material layer.

16. The method of claim 15, further comprising:

after performing the developing step, performing a first etching process to the silicon-rich material layer using the separated first resist segments and separated second resist segments as an etch mask; and performing a second etching process to the carbon-rich material layer using the silicon-rich material layer as an etch mask.

17. The method of claim 5, wherein the cross-linker is one of the following:

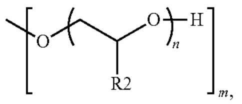

R2 represents a substituted or unsubstituted linear, branched, or cyclic alkyl group having 1 to 20 carbon atoms, and m and n are integers in a range from 2 to 6.

18. The method of claim 5, wherein the solvent is amide in aqueous phase.

19. The method of claim 5, wherein the solvent is amine in aqueous phase.

20. The method of claim 5, wherein the solvent is in aqueous phase.

* * * * *